United States Patent [19]
Miyazawa

[11] Patent Number: 5,115,443
[45] Date of Patent: May 19, 1992

[54] SEMICONDUCTOR LASER APPARATUS
[75] Inventor: Seiichi Miyazawa, Sagamihara, Japan
[73] Assignee: Canon Kabushiki Kaisha, Tokyo, Japan
[21] Appl. No.: 445,851
[22] PCT Filed: Mar. 22, 1989
[86] PCT No.: PCT/JP89/00303
  § 371 Date: Nov. 21, 1989
  § 102(e) Date: Nov. 21, 1989
[30] Foreign Application Priority Data
  Mar. 22, 1988 [JP] Japan .................. 63-065857
[51] Int. Cl.⁵ ............................. H01S 3/19
[52] U.S. Cl. ...................... 372/46; 372/45; 372/48; 357/16; 357/17
[58] Field of Search .......... 372/46, 45, 48, 43; 357/16, 17

[56] References Cited
U.S. PATENT DOCUMENTS
4,503,539 3/1985 Mori et al. .................. 372/46
4,785,457 11/1988 Asbeck et al. .............. 372/46
4,839,307 6/1989 Imanaka et al. ............. 372/46
4,932,033 6/1990 Miyazawa et al. ........... 372/46

FOREIGN PATENT DOCUMENTS
0207690 12/1983 Japan ...................... 372/46
0265787 11/1987 Japan .
0056981 3/1988 Japan .
0024692 4/1988 Japan .

Primary Examiner—Georgia Epps
Attorney, Agent, or Firm—Fitzpatrick, Cella, Harper & Scinto

[57] ABSTRACT

In a semiconductor laser apparatus of the invention, a semiconductor layer as a substrate on which various semiconductor layers are laminated has a groove or projection having a trapezoidal cross section which extends in the direction of a resonator, and at least one of the semiconductor layers locating on the upstream side of the active layer on a path of a current flowing when a forward bias voltage is applied to electrodes contains p or n type impurity.

21 Claims, 3 Drawing Sheets

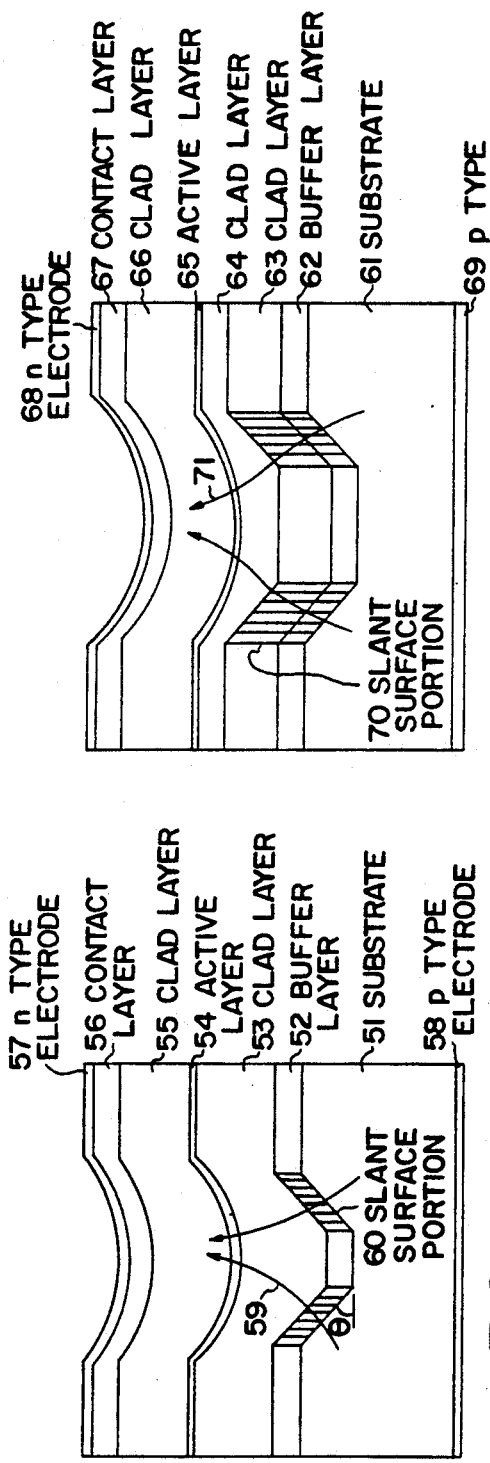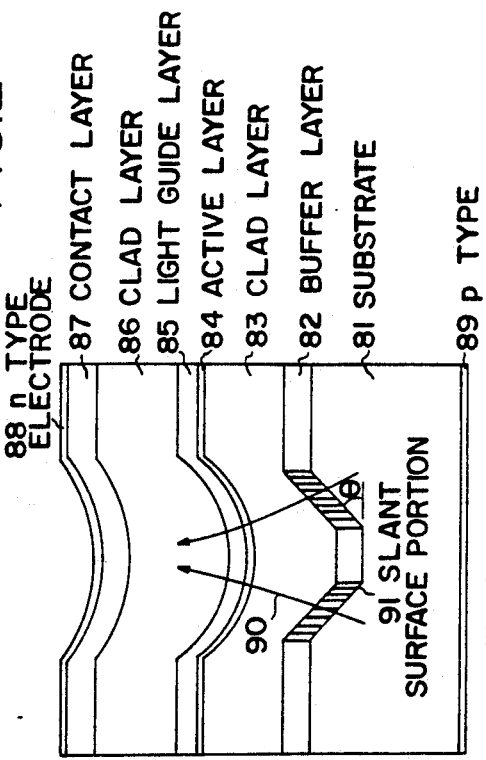

SEMICONDUCTOR LASER APPARATUS

The present invention relates to a semiconductor laser apparatus and its manufacturing method and, more particularly, to a high efficient semiconductor laser and its simplified manufacturing method.

PRIOR ART

FIG. 6(a) is a schematic constructional diagram of a conventional semiconductor laser. FIG. 6(b) is a graph showing a distribution of refractive indices of such a laser.

In the diagram, a buffer layer 2 of n-GaAs having a thickness of about 0.5 $\mu$m is formed on an n-GaAs substrate 1. Further, a clad layer 3 of n-Al$_x$Ga$_y$As (x=0.3, y=0.7) having a thickness of 1.5 $\mu$m is formed on the buffer layer 2.

Next, a non-doped GaAs active layer 4 having a thickness of 0.1 $\mu$m and a clad layer 5 of p-Al$_x$Ga$_y$As (x=0.3, y=0.7) having a thickness of 1.5 $\mu$m are formed. Further, a p-GaAs contact layer 6 having a thickness of 0.5 $\mu$m is formed. Finally, an Au-Ge electrode 7 and an Au-Sn electrode 8 are formed.

When a voltage is applied to the semiconductor laser having the above construction, a current applied from the electrode 7 spreads until it reaches the electrode 8. For instance, assuming that a thickness v of the electrode 7 is about 5 $\mu$m, the current spreads as shown by arrows 9 and a current which is necessary for oscillation also increases (about 150 to 200 mA).

Further, in the conventional example, as shown in FIG. 6(b), since a refractive index n of the active layer is set to about 3.65 and a refractive index n of the clad layer is set to about 3.4, although the light can be shut up in the vertical direction by the clad layers 2 and 5, the light cannot be shut up in the lateral direction. Therefore, there is a drawback such that the extent of the light increases, causing a deterioration of the differential quantum effect or the like.

FIGS. 7 and 8 are schematic constructional diagrams of conventional examples which have been proposed to solve the above drawbacks of the semiconductor laser.

In FIG. 7, an n buffer layer 12, an n clad layer 13, a non-doped active layer 14, and a p clad layer 15 are formed on an n type substrate 11. Further, a current blocking layer 16 of n-GaAs which is partially opened, a p clad layer 17, a p contact layer 18, and electrodes 19 and 20 are formed.

In such a construction, when a voltage is applied, a current flows from the electrode 19 to the electrode 20. At this time, since it is difficult for the current to flow in the portion of the current blocking layer 16, the currents are concentrated in the opening portion of the current blocking layer 16 as shown by arrows 22.

Further, when a distance 21 between the current blocking layer 16 and the active layer 14 is set to a value such as to cause the light absorption in the current blocking layer 16 in consideration of the leakage of the light from the active layer 14, the light emitting portion is limited to only the opening portion of the current blocking layer 16. Due to this, the laser oscillation can be caused by a low threshold value (typically, 30 to 40 mA).

As practical numerical values of the above laser structure, the distance 21 is set to 0.4 $\mu$m, a thickness and a carrier concentration of the current blocking layer 16 are set to 0.6 $\mu$m and 6×10 cm$^{-3}$, and carrier concentrations of the p clad layers 15 and 17 are set to 1×10 cm$^{-3}$. A width of the opening portion of the current blocking layer 16 is set to 3 $\mu$m.

In a semiconductor laser shown in FIG. 8, an n buffer layer 32, a clad layer 33, a non-doped active layer 34, p clad layers 35 and 36, a current blocking layer 41 of n-GaAs having an opening portion, a contact layer 37, and electrodes 40 and 38 are formed on a stairway-shaped n substrate 31.

In the above conventional example as well, the currents are concentrated in the opening portion of the current blocking layer 41 (shown by arrows 39). On the other hand, since there are differences of the refractive indices even in the lateral direction due to the stairway shape, the light is shut up in the stairway portion and a high efficiency can be accomplished.

PROBLEMS TO BE SOLVED BY THE INVENTION

However, in the above conventional semiconductor laser, in order to manufacture the current blocking layers (16, 41), after an n-GaAs layer was first formed on the whole surface, the opening portion needs to be formed by a chemical etching process or the like.

Consequently, there is a possibility such that a defect occurs due to the etching or a defect occurs due to the deposition of dust or the like when removing from a depositing chamber.

Further, since the current blocking layers (16, 41) are provided near the active layers (14, 34), it is necessary to accurately control the etching process. Particularly, in the laser shown in FIG. 8, since a slant portion is formed, it is difficult to control the etching process. In the lasers shown in FIGS. 7 and 8, the blocking of the current and the change in refractive index are realized by the layers 16 and 41, thereby controlling the light emitting portion. However, to form the current blocking layers 16 and 41, it is necessary to execute the growing process twice. Thus, there are problems such that the manufacturing steps become complicated and a defect likely occurs due to dust or the like.

As mentioned above, in the conventional semiconductor lasers, if it is intended to accomplish the blocking of the current and the shutting up of the light, there are drawbacks such that the manufacturing steps become complicated and difficult, the manufacturing yield deteriorates, and the reliability also becomes low.

MEANS FOR SOLVING THE PROBLEMS

The present invention is made to solve the above conventional drawbacks and it is a object of the invention to provide a semiconductor laser which is excellent in blocking of a current and shutting-up of a light and has a high reliability and also to provide a manufacturing method which can easily manufacture such a semiconductor laser.

To accomplish the above object, according to a semiconductor laser apparatus of the invention, a semiconductor layer as a substrate onto which various semiconductor layers are laminated has a groove or projection having a trapezoidal cross section which extends in the direction of a resonator, and at least one of the semiconductor layers located in the upstream portion of an active layer on a current path of a current which flows when a forward bias voltage is applied to an electrode containing p and n type impurity.

OPERATION

The terminology "p or n type impurity" means such an impurity which has a possibility to become p type impurity or to become n type impurity.

The p and n controls of GaAs by doping Si impurity as p or n type (amphoteric) impurity will be described hereinbelow.

In general, Si is n type impurity in GaAs. This is because on the (001) plane, that is, in a state in which As stably appears on the surface, when Si enters the position of Ga, it becomes the n type. However, there is a case where Ga stably appears on the oblique surface which is formed when a groove or projection was formed along the $<\bar{1}10>$ axis onto the (001) plane of the GaAs substrate. Such a surface corresponds to the Ga surface where Si can easily enter the position of As. In this case, As becomes the p type. As a condition such that Ga surface becomes the stable surface, an angle between the (001) plane and the oblique surface needs to be set to a value within a range from about 20° to 25° or more. When such an angle is about 20° or less, As becomes substantially the stable surface.

A report that Si doped GaAs changes in dependence on the surface as mentioned above has been illustrated in the literature by H. Nobuhara, O. Wada, and Y. Fujii, "SLOPE ANGLE INFLUENCE ON SILICON DOPING IN AlGaAs/GaAs MBE-GROWN ON STEPPED SURFACE OF (100) GaAs SUBSTRATE", Electronics Letters, 21, 35, 1987,. A plane which appears in the case where a groove or projection was formed along the $<\bar{1}10>$ axis onto the (001) plane is generally called an A plane. On the other hand, a plane such that As which is formed along the $<\bar{1}10>$ axis becomes stable is called a B plane.

Therefore, in the case where a groove or projection is formed on the GaAs substrate such that an angle between the groove or projection and the (001) plane is set to a value of 20° to 25° or more, and Si doped GaAs in grown on it, the portion formed on the (001) plane becomes the n type and the portion formed on the oblique surface becomes the p type.

BRIEF DESCRIPTION OF THE DRAWINGS

FIGS. 1 to 5 are cross sectional views showing a construction in each embodiment of a semiconductor laser apparatus according to the present invention; and FIGS. 6(a), 6(b), 7 and 8 are cross sectional views showing constructions of conventional examples.

EMBODIMENTS

Figure 4:
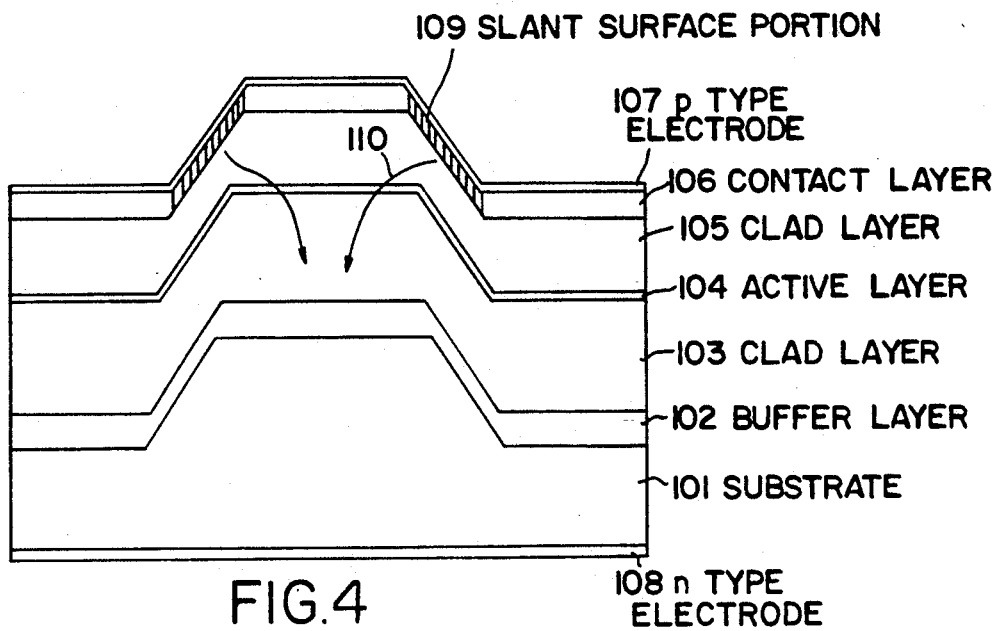

In an embodiment shown in FIG. 1, a groove which extends along the $<\bar{1}10>$ axis on the (001) plane is formed on a p-GaAs substrate 51 by a wet etching process. A buffer layer 52, a lower clad layer 53, an active layer 54, an upper clad layer 55, and a contact layer 56 are sequentially laminated on the substrate 51. The buffer layer 52 has a thickness of 0.5 $\mu$m and comprises Si doped GaAs. The lower clad layer 53 has a thickness of 1.2 $\mu$m and comprises Be doped $Al_{0.1}Ga_{0.5}As$. The active layer 54 functions as a multilayer quantum well (MQW). Five layers of non-doped $Al_{0.1}Ga_{0.9}As$ each having a thickness of 60 Å A are used as well layers. Four layers of non-doped $Al_{0.3}Ga_{0.7}As$ each having a thickness of 100 Å are used as barrier layers. The MQW is formed by alternately laminating those five well layers and four barrier layers. The upper clad layer 55 has a thickness of 1.5 $\mu$m and comprises Sn doped $Al_{0.5}Ga_{0.5}As$. The contact layer 56 has a thickness of 0.5 $\mu$m and comprises Sn doped GaAs. An n type electrode 57 comprising AuGe/Ni/Au and a p type electrode 58 comprising Cr/Au are formed at both ends of the substrate 51. The groove formed on the substrate 51 has a flat portion as a (001) plane at the bottom surface. A depth of the groove and a width of the bottom surface portion set to 1.0 $\mu$m. An angle $\theta$ between the slant surface of the groove and the bottom surface is set to about 55°. By growing Si doped GaAs onto the groove, only a portion 60 which is formed on the slant surface becomes the p type due to the foregoing operation and the portion which is formed on the (001) plane becomes the n type.

When only the slant surface portion 60 of the buffer layer 52 becomes the p type, currents when a forward bias voltage is applied to the n type electrode 57 and p type electrode 58 flow through the slant surface portion 60 as shown by arrows 59. Thus, carriers are concentrated to the active layer 54 in the portion corresponding to the position of the groove portion.

The reason why the bottom surface of the groove portion is flattened in the embodiment is because if the groove is formed in a V-shape and the bottom portion is made sharp, a strong possibility exists that a crystal which grows thereon is disordered. By flattening the bottom surface of the groove portion, the crystal property of the portion corresponding to the bottom surface becomes excellent and the efficient light emission was executed. Further, since the active layer is curved, the semiconductor laser having the excellent light shutting-up effect could be obtained.

The crystal at this time was grown by using a vacuum evaporation depositing process, particularly, an MBE (Molecular Beam Epitaxy) process. A temperature of substrate was set to a value within a range from 400° to 800° C. A flying molecular ratio $J_{As4}/J_{Ga}$ was set to 2. A growing speed was set to 1 $\mu$m/h (GaAs).

In the embodiment shown in FIG. 2, two clad layers are provided and a current blocking effect which is larger than that in the embodiment shown in FIG. 1 is accomplished by using not only the buffer layers but also the clad layers.

A groove which extends along the $<\bar{1}10>$ axis on the (001) plane is formed on a p-GaAs substrate 61 in a manner similar to that in the embodiment shown in FIG. 1. A buffer layer 62, a first lower clad layer 63, a second lower clad layer 64, an active layer 65, an upper clad layer 66, and a contact layer 67 are sequentially laminated on the substrate 61. The buffer layer 62 has a thickness of 0.5 $\mu$m and comprises Si doped GaAs. The first lower clad layer 63 has a thickness of 1.0 $\mu$m and comprises Si doped $Al_{0.5}Ga_{0.5}As$. The second lower clad layer 64 has a thickness of 0.5 $\mu$m and comprises Be doped $Al_{0.5}Ga_{0.5}As$. The active layer 65 is a multilayer quantum well (MQW) similar to that in the embodiment shown in FIG. 1. The upper clad layer 66 has a thickness of 1.5 $\mu$m and comprises Sn doped $Al_{0.5}Ga_{0.5}As$. The contact layer 67 has a thickness of 0.5 $\mu$m and comprises Sn doped GaAs. Thereafter, an n type electrode 68 comprising AuGe/Ni/Au and a p type electrode 69 comprising Cr/Au are formed at both ends of the substrate 61.

A slant portion 70 which is deposited on the oblique surface of the groove in the buffer layer 62 and first lower clad layer 63 becomes the p type in a manner similar to the case of the first embodiment. Thus, when a forward bias voltage is applied to the n type electrode 68 and p type electrode 69, currents flow as shown by arrows 71.

A width of groove which is formed on the substrate 61 is set to 10.0 μm or less and, more preferably, 5.0 μm or less. In the embodiment, it was set to 3.0 μm. A depth of groove was set to 2.0 μm.

In the embodiment shown in FIG. 3, by diffusing the light by providing a light guide layer, a breakdown of the edge surface is prevented.

A groove similar to that in the embodiment shown in FIG. 1 is formed on a p-GaAs substrate 81. A buffer layer 82, a lower clad layer 83, an active layer 84, a light guide layer 85, an upper clad layer 86, and a contact layer 87 are sequentially laminated on the substrate 81. The buffer layer 82 has a thickness of 0.5 μm and comprises Si doped GaAs. The lower clad layer 83 has a thickness of 1.5 μm and comprises Be doped $Al_{0.4}Ga_{0.6}As$. The active layer 84 has a thickness of 0.1 μm and comprises non-doped GaAs. The light guide layer 85 has a thickness of 0.3 μm and comprises Sn doped $Al_{0.3}Ga_{0.7}As$. The upper clad layer 86 has a thickness of 1.2 μm and comprises Sn doped $Al_{0.4}Ga_{0.6}As$. The contact layer 87 has a thickness of 0.3 μm and comprises Sn doped GaAs. An n type electrode 88 comprising AuGe/NiAu and a p type electrode 89 comprising Cr/Au are formed at both ends of the substrate 81.

In the embodiment, a width of the bottom portion of the groove was set to 1.0 μm and a depth was set to 1.5 μm. The angle θ between the (001) plane and the slant surface was set to about 55° when a wet etching process is used. However, the angle θ can be set to an arbitrary value if another dry etching process (Al, $Cl_2$, or the like) is used.

The current blocking in the embodiment is accomplished by a slant portion 91 of the buffer layer 82 in a manner similar to the first embodiment. When a forward bias voltage is applied to the n type electrode 88 and p type electrode 89, currents flow as shown by arrows 90. The lights generated are concentrated to the central curved portion of the active layer 84. On the other hand, at this time, since the light guide layer 85 is formed, a breakdown of the edge surface is prevented.

In an embodiment shown in FIG. 4, by using an n type substrate, a current blocking area is provided on the side of an epitaxial layer in the upper portion of an active layer.

A projection having a trapezoidal cross section in which a height is 2.0 μm and a width of the upper surface is 6.0 μm and which extends along the $<\bar{1}10>$ axis on the (001) plane is formed on an n-GaAs substrate 101 by a wet etching process. A buffer layer 102, a lower clad layer 103, an active layer 104, an upper clad layer 105, and a contact layer 106 are sequentially laminated on the substrate 101. The buffer layer 102 has a thickness of 0.5 μm and comprises Sn doped GaAs. The lower clad layer 103 has a thickness of 1.5 μm and comprises Sn doped $Al_{0.3}Ga_{0.7}As$. The active layer 104 comprises non-doped GaAs. The upper clad layer 105 comprises Be doped $Al_{0.3}Ga_{0.7}As$. The contact layer 106 has a thickness of 0.5 μm and comprises Si doped GaAs. A p type electrode 107 comprising Cr/Au and an n type electrode 108 comprising AuGe/Ni/Au are formed at both ends of the substrate 101.

Since only a slant portion 109 corresponding to the oblique surface of the projecting portion of the contact layer 106 becomes the p type, when a forward bias voltage is applied to the p type electrode 107 and n type electrode 108, currents flow as shown by arrows 110.

In the embodiment, the epitaxial layer was grown by a vacuum evaporation depositing process. A temperature of substrate was set to 700°C. A flying molecular ratio $J_{As4}/J_{Ga}$ was set to 2. A growing speed of GaAs was set to 1 μm/h.

Figure 5:
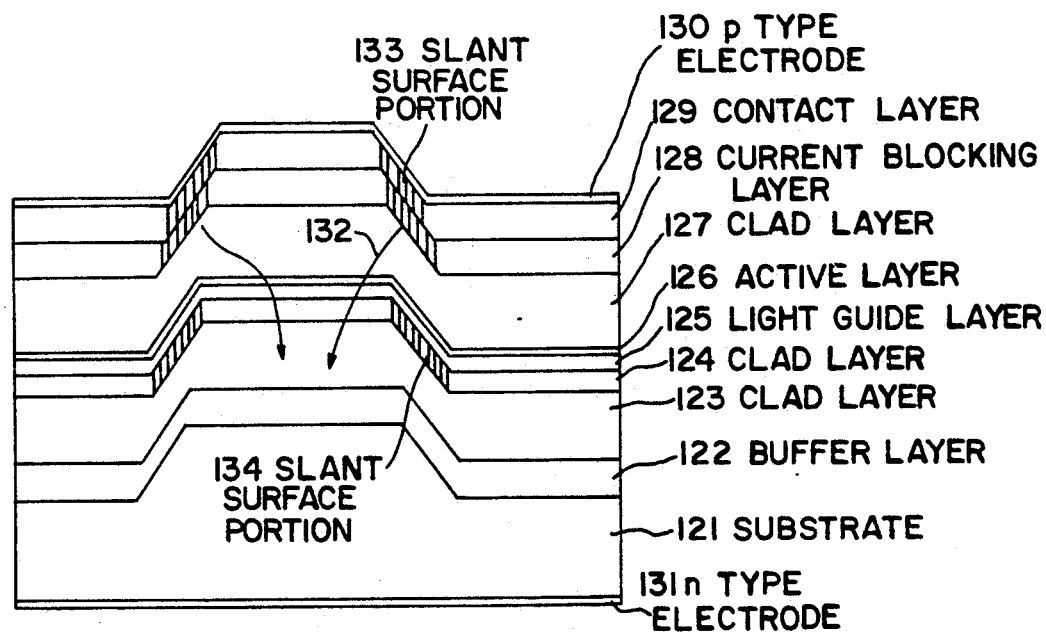
Figure 6A:
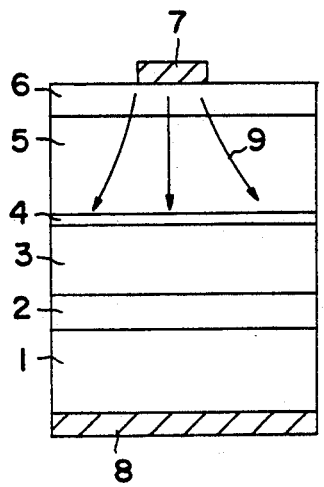
Figure 6A:
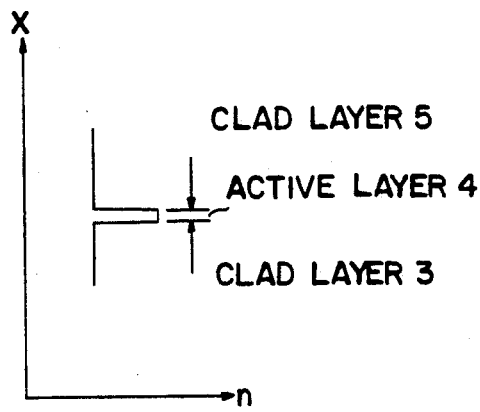
Figure 7:
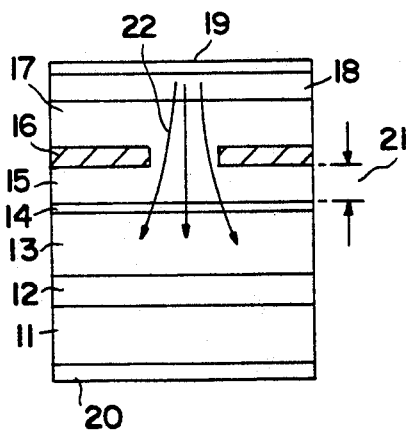
Figure 8:
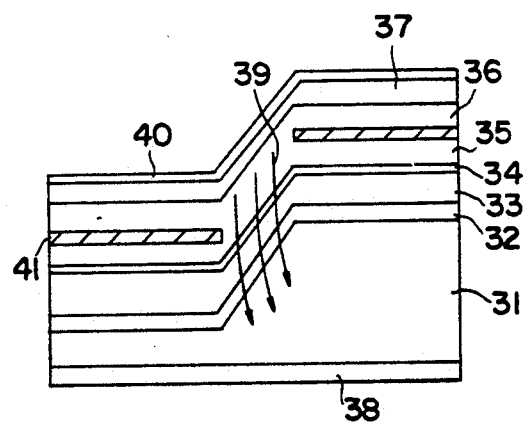

In an embodiment shown in FIG. 5, by providing current blocking layers at positions on and under an active layer, the current blocking effect is further increased and, at the same time, by providing a light guide layer, a breakdown of the edge surface is prevented.

A projection having a trapezoidal cross section in which a height is set to 1.0 μm and a width of the upper surface is set to 4.0 μm and which extends along the $<\bar{1}10>$ axis on the (001) plane is formed on an N-GaAs substrate 121 by a wet etching process. A buffer layer 122, a first lower clad layer 123, a second lower clad layer 124, a light guide layer 125, an active layer 126, an upper clad layer 127, a current blocking layer 128, and a contact layer 129 are sequentially laminated on the substrate 121. The buffer layer 122 has a thickness of 0.5 μm and comprises Sn doped GaAs. The first lower clad layer 123 has a thickness of 0.8 μm and comprises Sn doped $Al_{0.5}Ga_{0.5}As$. The second lower clad layer 124 has a thickness of 0.5 μm and comprises Si doped $Al_{0.5}Ga_{0.5}As$. The light guide layer 125 has a thickness 0.3 μm and comprises Sn doped $Al_{0.3}Ga_{0.7}As$. The active layer 126 is a multilayer quantum well (MQW) having a construction similar to those of the embodiments shown in FIGS. 1 and 2. The upper clad layer 127 has a thickness of 1.0 μm and comprises Be doped $Al_{0.5}Ga_{0.5}As$. The current blocking layer 128 has a thickness of 0.5 μm and comprises Si doped $Al_{0.5}Ga_{0.5}As$. The contact layer 129 comprises Si doped GaAs. A p type electrode 130 comprising Cr/Au and an n type electrode 131 comprising AuGe/Ni/Au are formed at both ends of the substrate 121.

Slant portions 133 and 134 corresponding to the oblique surfaces of the projecting portions of the Si doped clad layer 124, current blocking layer 128, and contact layer 129 become the p type. Therefore, when a forward bias voltage is applied to the p type electrode 130 and n type electrode 131, currents flow as shown by arrows 132.

In the embodiment, the substrate was formed by a vacuum evaporation depositing process. At this time, a growing temperature was set to 450° C., a flying molecular ratio $J_{As4}/J_{Ga}$ was set to 2, and a growing speed of GaAs was set to 1 μm/h.

In the embodiment, a height of projection which is formed on the substrate was set to 1.0 μm. However, in the case of forming a p type area on the oblique surface of the contact layer 129, if a growing temperature of the substrate is low, it is sufficient to form the p type area having a thickness of about 1.0 μm. However, if the growing temperature is high, it is necessary to form the p type area having a thickness of 2.0 to 3.0 μm or more.

Although the above embodiments have been described on the assumption that the groove or projection which is formed on the substrate extends along the <110> axis on the (001) plane, it is not always necessary to form the groove or projection in the direction which perfectly coincides with the <110> axis but an angle within a range of ±15° from the <110> axis is permitted. On the other hand, although only the AlGaAs/GaAs system has been described as a kind of semiconductor, the invention can be also applied to InP, AlGaInP, InGaAsP, etc. in accordance with the conditions.

EFFECTS OF THE INVENTION

The following effects are obtained by the present invention in which a semiconductor laser is constructed as described above.

Since the substrate having a groove or projection having a trapezoidal cross section is used and the semiconductor layer containing p or n type impurity is used, there is an effect such that it is possible to form a semiconductor laser apparatus having the excellent current blocking effect and excellent light shutting-up effect.

I claim:

1. A semiconductor laser apparatus comprising:
   a substrate in which a cross section extending in a resonant direction has a groove with a trapezoid shape, said substrate comprising a p type semiconductor, the width of said groove falling in the range of 3 to 10 $\mu m$;
   a buffer layer comprising a semiconductor containing p and n type impurity, formed on said substrate, in said buffer layer a portion formed on an oblique surface of said groove having a p type polarity and the other portion having n type polarity;
   a first clad layer comprising a p type semiconductor formed on said buffer layer;
   an active layer comprising a non-doped semiconductor formed on said first clad layer;
   a second clad layer comprising a n type semiconductor formed on said active layer;
   a n type electrode formed on said second clad layer; and
   a p type electrode formed on the bottom surface of said substrate.

2. A semiconductor laser apparatus according to claim 1, wherein said groove is formed along a axis on a (001) plane of said substrate, and the oblique surface of said groove defines an angle of 20° to 25° with respect to the (001) plane.

3. A semiconductor laser apparatus according to claim 1, further comprising a light guide layer provided in contact with said active layer.

4. A semiconductor laser apparatus according to claim 1, further comprising a contact layer comprising a n-type semiconductor formed between said second clad layer and said n-type electrode.

5. A semiconductor laser apparatus according to claim 1, wherein said active layer has a multilayer quantum well structure in which a plurality of well layers and a plurality of barrier layers are alternately laminated.

6. A semiconductor laser apparatus comprising:
   a substrate in which a cross section extending in a resonant direction has a groove with a trapezoid shape, said substrate comprising a p-type semiconductor, the width of said groove falling in the range of 3 to 10 $\mu m$;
   a first clad layer comprising a semiconductor containing a p- and n-type impurity, formed on said substrate, in said first clad layer a portion formed on an oblique surface of said groove has a p-type polarity and the other portion thereof has a n-type polarity;
   a second clad layer comprising a p-type semiconductor formed on said first clad layer;
   an active layer comprising a non-doped semiconductor formed on said second clad layer;
   a third clad layer comprising a n-type semiconductor formed on said active layer;
   a n-type electrode formed on said third clad layer; and
   a p-type electrode formed on the bottom surface of said substrate.

7. A semiconductor laser apparatus according to claim 6, wherein said groove is formed along a axis on a (001) plan of said substrate, and the oblique surface of said groove defines an angle of 20° to 25° with respect to the (001) plane.

8. A semiconductor laser apparatus according to claim 6, further comprising a buffer layer formed between said substrate and said first clad layer.

9. A semiconductor laser apparatus according to claim 8, wherein said buffer layer comprising a semiconductor containing a p- and n-type impurity, and in said buffer layer a portion formed on the oblique surface of said groove has a p-type polarity and the other portion has a n-type polarity.

10. A semiconductor laser apparatus according to claim 6, further comprising a contact layer comprising a n-type semiconductor formed between said third clad layer and said n-type electrode.

11. A semiconductor laser apparatus according to claim 6, wherein said active layer has a multilayer quantum well structure in which a plurality of well layers and a plurality of barrier layers are alternately laminated.

12. A semiconductor laser apparatus comprising:
    a substrate in which a cross section extending in a resonant direction has a projection with a trapezoid shape, said substrate comprising a n-type semiconductor;
    a first clad layer comprising a n-type semiconductor formed on said substrate;
    an active layer comprising a non-doped semiconductor formed on said first clad layer;
    a second clad layer comprising a p-type semiconductor formed on said active layer;
    a current blocking layer comprising a semiconductor containing a p- and n-type impurity, formed on said second clad layer, in said current blocking layer a portion formed on an oblique surface of said projection has a p-type polarity and the other portion has a n-type polarity;
    a p-type electrode formed on said current blocking layer; and
    a n-type electrode formed on the bottom surface of said substrate.

13. A semiconductor laser apparatus according to claim 12, wherein said projection is formed along a axis on a (001) plane of said substrate, and the oblique surface of said projection defines an angle of 20° to 25° with respect to the (001) plane.

14. A semiconductor laser apparatus according to claim 12, further comprising a contact layer formed between said current blocking layer and said p-type electrode.

15. A semiconductor laser apparatus according to claim 14, wherein said contact layer comprises a semiconductor containing a p- and n-type impurity, and in said contact layer a portion formed on the oblique surface of said projection has a p-type polarity and the other portion has a n-type polarity.

16. A semiconductor laser apparatus according to claim 12, further comprising a third clad layer comprising a semiconductor containing a p- and n-type impurity, formed between said first clad layer and said active layer, and wherein in said third clad layer a portion formed on the oblique surface of said projection has a p-type polarity and the other portion has a n-type polarity.

17. A semiconductor laser apparatus according to claim 16, further comprising a light guide layer comprising a n-type semiconductor formed between said third clad layer and said active layer.

18. A semiconductor laser apparatus according to claim 12, wherein said active layer has a multilayer quantum well structure in which a plurality of well layers and a plurality of barrier layers are alternately laminated.

19. A semiconductor laser apparatus comprising:
a substrate in which a cross section extending in a resonant direction has a projection with a trapezoid shape, said substrate comprising a n-type semiconductor;
a first clad layer comprising a n-type semiconductor formed on said substrate;
an active layer comprising a non-doped semiconductor formed on said first clad layer;
a second clad layer comprising a p-type semiconductor formed on said active layer;
a contact layer comprising a semiconductor containing a p- and n-type impurity formed on said second clad layer, in said contact layer a portion formed on the oblique surface of said projection having a p-type polarity and the other portion having a n-type polarity;
a p-type electrode formed on said contact layer; and
a n-type electrode formed on the bottom surface of said substrate.

20. A semiconductor laser apparatus according to claim 19, wherein said projection is formed along a axis on (001) plane of said substrate, and the oblique surface of said projection defines an angle of 20° to 25° with respect to the (001) plane.

21. A semiconductor laser apparatus according to claim 19, wherein said active layer has a multilayer quantum well structure in which a plurality of well layers and a plurality of barrier layers are alternately laminated.

* * * * *

UNITED STATES PATENT AND TRADEMARK OFFICE
CERTIFICATE OF CORRECTION

PATENT NO. : 5,115,443
DATED : May 19, 1992
INVENTOR(S) : SEIICHI MIYAZAWA

Page 1 of 3

It is certified that error appears in the above-identified patent and that said Letters Patent is hereby corrected as shown below:

ON THE TITLE PAGE:

IN [56] REFERENCES CITED

Under FOREIGN PATENT DOCUMENTS,
"0024692  4/1988  Japan ." should read
--0024692  2/1988  Japan .--.

COLUMN 1

Line 28, "v" should be deleted.

COLUMN 2

Line 68, "containing" should read --contains--.

COLUMN 3

Line 39, "in" should read --is--.
Line 45, "cross sectional" should read --cross-sectional--.
Line 48, "cross sectional" should read --cross-sectional--.
Line 61, "quantµm" should read --quantum--.
Line 63, "60 Å A" should read --60 Å--.

COLUMN 4

Line 8, "set" should read --are set--.

COLUMN 5

Line 18, "6As." should read --$_6$As.--.
Line 21, "3Ga$_{0.7}$As." should read --$_3$Ga$_{0.7}$As.--.
Line 25, "AuGe/NiAu" should read --AuGe/Ni/Au--.

UNITED STATES PATENT AND TRADEMARK OFFICE
CERTIFICATE OF CORRECTION

PATENT NO. : 5,115,443

DATED : May 19, 1992

INVENTOR(S) : SEIICHI MIYAZAWA

Page 2 of 3

It is certified that error appears in the above-identified patent and that said Letters Patent is hereby corrected as shown below:

COLUMN 6

Line 14, "N-GaAs" should read --n-GaAs--.
Line 25, "5Ga$_{0.5}$As." should read --$_5$Ga$_{0.5}$As.-- and "thickness 0.3" should read --thickness of 0.3--.
Line 30, "1,0 µm" should read --1.0 µm--.
Line 60, "<110> axis" should read --<$\bar{1}$10> axis--.
Line 62, "<110> axis" should read --<$\bar{1}$10> axis--.
Line 63, "<110> axis" should read --<$\bar{1}$10> axis--.

COLUMN 7

Line 35, "a axis" should read --a [110] axis--.

COLUMN 8

Line 6, "a axis" should read --a [110] axis--.
Line 7, "(001) plan" should read --(001) plane--.
Line 50, "a axis" should read --a [110] axis--.

UNITED STATES PATENT AND TRADEMARK OFFICE
CERTIFICATE OF CORRECTION

PATENT NO. : 5,115,443
DATED      : May 19, 1992
INVENTOR(S) : SEIICHI MIYAZAWA

It is certified that error appears in the above-identified patent and that said Letters Patent is hereby corrected as shown below:

COLUMN 10

Line 13, "a axis" should read --a [110] axis--.
    Line 14, "on (001) plane" should read --on a (001) plane--.

Signed and Sealed this

Nineteenth Day of April, 1994

Attest:

BRUCE LEHMAN

Attesting Officer    Commissioner of Patents and Trademarks